(12) United States Patent
Satoh et al.

(10) Patent No.: US 10,857,598 B2
(45) Date of Patent: Dec. 8, 2020

(54) COATED CUTTING TOOL

(71) Applicant: TUNGALOY CORPORATION, Fukushima (JP)

(72) Inventors: Hiroyuki Satoh, Iwaki (JP); Kinya Takahashi, Iwaki (JP)

(73) Assignee: TUNGALOY CORPORATION, Iwaki (JP)

( * ) Notice: Subject to any disclaimer, the term of this patent is extended or adjusted under 35 U.S.C. 154(b) by 199 days.

(21) Appl. No.: 16/116,084

(22) Filed: Aug. 29, 2018

(65) Prior Publication Data

US 2019/0076934 A1 Mar. 14, 2019

(30) Foreign Application Priority Data

Sep. 14, 2017 (JP) ................................. 2017-176414

(51) Int. Cl.
*B23B 27/14* (2006.01)
*C23C 16/36* (2006.01)
(Continued)

(52) U.S. Cl.
CPC ........ *B23B 27/148* (2013.01); *C01B 21/0828* (2013.01); *C23C 16/029* (2013.01);
(Continued)

(58) Field of Classification Search
CPC . B23B 27/14; B23B 27/148; B23B 2228/105; B23B 2228/36; C23C 16/30;
(Continued)

(56) References Cited

U.S. PATENT DOCUMENTS 7,897,247 B2 * 3/2011 Martensson ............ C23C 16/30
51/307
7,906,230 B2 * 3/2011 Watanabe ............... C23C 16/36
428/698

(Continued)

FOREIGN PATENT DOCUMENTS

CN 103171178 * 6/2013
JP 06-158325 * 6/1994
(Continued)

*Primary Examiner* — Archene A Turner
(74) *Attorney, Agent, or Firm* — Studebaker & Brackett PC

(57) ABSTRACT

A coated cutting tool, comprising: a substrate; and a coating layer formed on the substrate, wherein the coating layer includes a lower part layer and an upper part layer formed on the lower part layer, the lower part layer has an average thickness of 2.0 μm or more and 15.0 μm or less, and is formed of a Ti oxycarbonitride layer including a compound having a composition represented by formula (1) below:

$$Ti(C_{1-x-y}N_xO_y) \quad (1)$$

(where, x denotes an atomic ratio of an N element based on a total of a C element, the N element, and an O element, y denotes an atomic ratio of the O element based on a total of the C element, the N element, and the O element, and $0.35 \le x \le 0.60$ and $0.01 \le y \le 0.10$ are satisfied),
a FWHM of a rocking curve of a plane (4,2,2) of the lower part layer, which is obtained through X-ray diffraction, is 20° or less, the upper part layer is formed of an α-aluminum oxide layer having an average thickness of 1.0 μm or more and 15.0 μm or less, and a FWHM of a rocking curve of a plane (0,0,12) of the upper part layer, which is obtained through X-ray diffraction, is 20° or less.

20 Claims, 1 Drawing Sheet

(51) Int. Cl.
*C01B 21/082* (2006.01)
*C23C 16/40* (2006.01)
*C23C 16/32* (2006.01)
*C23C 28/04* (2006.01)
*C23C 16/02* (2006.01)
*C23C 30/00* (2006.01)
*C22C 29/06* (2006.01)
*C22C 29/08* (2006.01)

(52) U.S. Cl.
CPC ............ *C23C 16/32* (2013.01); *C23C 16/36* (2013.01); *C23C 16/403* (2013.01); *C23C 28/044* (2013.01); *C23C 30/005* (2013.01); *B23B 2228/04* (2013.01); *B23B 2228/105* (2013.01); *C22C 29/062* (2013.01); *C22C 29/067* (2013.01); *C22C 29/08* (2013.01)

(58) Field of Classification Search
CPC ......... C23C 16/32; C23C 16/34; C23C 16/36; C23C 16/403; C23C 28/04; C23C 28/042; C23C 28/044; C23C 28/34; C23C 28/345; C23C 28/347; C23C 30/005
USPC .......... 51/307, 309; 428/216, 336, 697, 698, 428/699, 701, 702
See application file for complete search history.

(56) References Cited

U.S. PATENT DOCUMENTS

| 8,043,729 | B2* | 10/2011 | Sundstrom | C23C 16/30 |
| | | | | 428/336 |
| 2015/0003925 | A1 | 1/2015 | Ostlund et al. | |
| 2016/0175940 | A1* | 6/2016 | Lindahl | C23C 28/044 |
| | | | | 428/141 |
| 2018/0258525 | A1 | 9/2018 | Cho et al. | |

FOREIGN PATENT DOCUMENTS

| JP | 2001-25905 A | 1/2001 |
| JP | 2015-009358 A | 1/2015 |
| KR | 10-1687142 B1 | 12/2016 |
| WO | 2012/079769 A1 | 6/2012 |

* cited by examiner

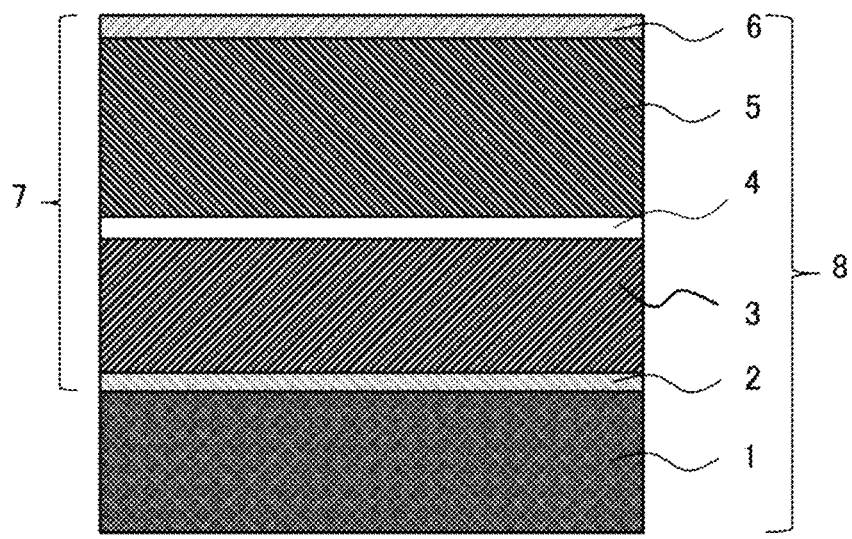

COATED CUTTING TOOL

TECHNICAL FIELD

The present invention relates to a coated cutting tool.

BACKGROUND ART

It has been conventionally well known to employ, for the cutting of steel, cast iron, etc., a coated cutting tool which is obtained by depositing, via chemical vapor deposition, a coating layer with a total thickness of from 3 μm or more to 20 μm or less on a surface of a substrate consisting of a cemented carbide. A known example of the above coating layer is a coating layer consisting of a single layer of one kind selected from the group consisting of a Ti carbide, a Ti nitride, a Ti carbonitride, a Ti carboxide, a Ti oxycarbonitride, and aluminum oxide, or consisting of multiple layers of two or more kinds selected therefrom.

For example, Patent Document 1 proposes, for the purpose of improving wear resistance in cutting operation, a coated cutting tool including a substrate and a coating. The coating includes a MTCVD TiCN layer and an α-Al$_2$O$_3$ layer. The α-Al$_2$O$_3$ layer has a texture coefficient TC(0012) of more than 5. In the flank of the cutting tool, the full width at half maximum (FWHM) of the rocking curve peak of a plane (0012) of the α-Al$_2$O$_3$ layer, which is obtained using X-ray diffraction, is less than 30°, and the TiCN layer has, between the integrated area intensity of the 220 peak and the integrated area intensity of the 331 peak that is less than 3 in X-ray diffraction, a relationship I220/I311.

CITATION LIST

Patent Documents

Patent Document 1: JP2015-9358 A

SUMMARY

Technical Problem

In cutting in recent years, a cutting speed, a feeding speed, and a cut-in depth have been remarkably increased, and hence it is demanded to further improve the wear resistance and the fracture resistance of conventional coated cutting tools such as the one in Patent Document 1. Especially, there is an increase in opportunity of high-speed cutting of steel or the like, which places loads on coated cutting tools. Under such severe cutting conditions, in a conventional coated cutting tool in which adhesion of a coating layer is insufficient, fracturing due to peeling occurs. Consequently, a long tool life cannot be achieved, which is a problem.

In view of the foregoing, an object of the present invention is to provide a coated cutting tool that has excellent fracture resistance and wear resistance, and can thus achieve extension of its tool life.

Solution to Problem

From the perspective as that set forth above, the present inventors have conducted studies regarding extension of the tool life of a coated cutting tool and have accordingly found that wear resistance and fracture resistance can be improved, and as a result, the tool life can be extended with the following configurations: a coating layer includes a lower part layer and an upper part layer of a predetermined α-aluminum oxide layer formed on the lower part layer; the lower part layer includes a predetermined Ti oxycarbonitride layer; and a full width at half maximum (FWHM) of a rocking curve in a predetermined plane is set to a specific value or less. The present inventors have completed the present invention based on such findings.

Specifically, the present invention is as set forth below.

[1] A coated cutting tool, including:
a substrate; and
a coating layer formed on the substrate, wherein
the coating layer includes a lower part layer and an upper part layer formed on the lower part layer,
the lower part layer has an average thickness of 2.0 μm or more and 15.0 μm or less, and is formed of a Ti oxycarbonitride layer including a compound having a composition represented by formula (1) below:

$$Ti(C_{1-x-y}N_xO_y) \quad (1)$$

(where, x denotes an atomic ratio of an N element based on a total of a C element, the N element, and an O element, y denotes an atomic ratio of the O element based on a total of the C element, the N element, and the O element, and 0.35≤x≤0.60 and 0.01≤y≤0.10 are satisfied),
a full width at half maximum of a rocking curve of a plane (4,2,2) of the lower part layer, which is obtained through X-ray diffraction, is 20° or less;
the upper part layer is formed of an α-aluminum oxide layer having an average thickness of 1.0 μm or more and 15.0 μm or less, and
a full width at half maximum of a rocking curve of a plane (0,0,12) of the upper part layer, which is obtained through X-ray diffraction, is 20° or less.

[2] The coated cutting tool according to [1], wherein each of particles forming the lower part layer has an average particle size of 0.5 μm or more and 1.5 μm or less.

[3] The coated cutting tool according to [1] or [2], wherein the coating layer includes, between the lower part layer and the upper part layer, an intermediate layer formed of a Ti compound layer including a compound having a composition represented by formula (2) below:

$$Ti(C_{1-a-b}N_aO_b) \quad (2)$$

(where, a denotes the atomic ratio of the N element based on a total of the C element, the N element, and the O element, b denotes the atomic ratio of the O element based on a total of the C element, the N element, and the O element, and 0.00≤a≤0.30 and 0.01≤b≤0.10 are satisfied), and the intermediate layer has an average thickness of 0.05 μm or more and 1.50 μm or less.

[4] The coated cutting tool according to any one of [1] to [3], wherein:
the coating layer includes a lowermost layer formed of a Ti nitride layer or a Ti carbide layer between the substrate and the lower part layer; and
the lowermost layer has an average thickness of 0.1 μm or more and 1.5 μm or less.

[5] The coated cutting tool according to any one of [1] to [4], wherein the entire coating layer has an average thickness of 3.0 μm or more and 25.0 μm or less.

[6] The coated cutting tool according to any one of [1] to [5], wherein the substrate is one of a cemented carbide, cermet, ceramics, and a cubic boron nitride sintered body.

Advantageous Effects of Invention

According to the present invention, it is possible to provide a coated cutting tool that has excellent fracture resistance and wear resistance, and can thus achieve extension of its tool life.

BRIEF DESCRIPTION OF DRAWINGS

The FIGURE is a schematic sectional view showing an example of a coated cutting tool of the present invention.

DESCRIPTION OF EMBODIMENTS

An embodiment for carrying out the present invention (hereinafter simply referred to as the "present embodiment") will hereinafter be described in detail referring to the drawings as appropriate. However, the present invention is not limited to the present embodiment below. Various modifications may be made to the present invention without departing from the gist of the invention.

A coated cutting tool of the present embodiment includes:
a substrate; and
a coating layer formed on the substrate, wherein
the coating layer includes a lower part layer and an upper part layer formed on the lower part layer,
the lower part layer has an average thickness of 2.0 μm or more and 15.0 μm or less, and is formed of a Ti oxycarbonitride layer including a compound having a composition represented by formula (1) below:

$$\text{Ti}(C_{1-x-y}N_xO_y) \quad (1)$$

(where, x denotes an atomic ratio of an N element based on a total of a C element, the N element, and an O element, y denotes an atomic ratio of the O element based on a total of the C element, the N element, and the O element, and $0.35 \leq x \leq 0.60$ and $0.01 \leq y \leq 0.10$ are satisfied),
a FWHM of a rocking curve of a plane (4,2,2) of the lower part layer, which is obtained through X-ray diffraction, is 20° or less,
the upper part layer is formed of an α-aluminum oxide layer having an average thickness of 1.0 μm or more and 15.0 μm or less, and
a FWHM of a rocking curve of a plane (0,0,12) of the upper part layer, which is obtained through X-ray diffraction, is 20° or less.

The coated cutting tool of the present embodiment has the above-mentioned configurations, and can thus achieve improvement of wear resistance and fracture resistance. As a result, the tool life of the coated cutting tool can be extended. The following are conceivable as factors of improvement of the wear resistance of the coated cutting tool of the present embodiment. However, the present invention is by no means limited to the following factors. Specifically, firstly, the coated cutting tool of the present embodiment has improved hardness, and thus has improved wear resistance because the lower part layer has the atomic ratio x that is 0.60 or less in formula (1) above. Further, the coated cutting tool of the present embodiment has improved wear resistance because the average thickness of the lower part layer is 2.0 μm or more. Further, the coated cutting tool of the present embodiment has improved wear resistance as a result of the following. Specifically, the FWHM of the rocking curve of the plane (0,0,12) of the upper part layer, which is obtained through X-ray diffraction, is 20° or less, and hence the number of structures of the plane (0,0,12) present in parallel to the substrate is large. An increase in cutting temperature in cutting is consequently prevented, which prevents reaction wear. Further, the coated cutting tool of the present embodiment has improved wear resistance because the average thickness of the upper part layer is 1.0 μm or more, and hence the effects of the upper part layer last. It is conceivable that the coated cutting tool of the present embodiment has a combination of these configurations, and therefore has remarkably improved wear resistance. Meanwhile, the following are conceivable as factors of improvement of the fracture resistance of the coated cutting tool of the present embodiment. However, the present invention is by no means limited to the following factors. Specifically, firstly, the coated cutting tool of the present embodiment has improved fracture resistance because the lower part layer satisfies the following in formula (1): the atomic ratio x is 0.35 or more, which provides excellent toughness; the atomic ratio y is 0.01 or more, which provides improved adhesion between the lower part layer and the upper part layer; and the atomic ratio y is 0.10 or less, which provides improved strength of the lower part layer. Further, the coated cutting tool of the present embodiment has improved fracture resistance because the average thickness of the lower part layer is 15.0 μm or less, and hence the coating layer is prevented from being peeled off. Next, the coated cutting tool of the present embodiment has improved fracture resistance because the average thickness of the upper part layer is 15.0 μm or less, and hence the coating layer is prevented from being peeled off. Next, the coated cutting tool of the present embodiment has improved fracture resistance because the FWHM of the rocking curve of the plane (4,2,2) of the lower part layer, which is obtained through X-ray diffraction, is 20° or less, and hence the adhesion between the lower part layer and the upper part layer is improved, with the result that the effects of the upper part layer last. It is conceivable that the coated cutting tool of the present embodiment has a combination of these configurations, and therefore has remarkably improved fracture resistance.

The FIGURE is a schematic sectional view showing an example of the coated cutting tool of the present invention. A coated cutting tool 8 includes a substrate 1 and a coating layer 7 formed on the surface of the substrate 1. In the coating layer 7, a lowermost layer 2, a lower part layer 3, an intermediate layer 4, an upper part layer 5, and an outermost layer 6 are laminated in the stated order toward the top. As the types of the coated cutting tool, specifically, indexable cutting insert for milling or turning, a drill, and an end mill are given.

The substrate used in the present embodiment is not particularly limited, as long as it may be used as a substrate for the coated cutting tool. Examples of the substrate include a cemented carbide, cermet, ceramics, a cubic boron nitride sintered body, a diamond sintered body, and high-speed steel. From among the above examples, the substrate is preferably one of a cemented carbide, cermet, ceramics, and a cubic boron nitride sintered body because the coated cutting tool of the present embodiment has further excellent wear resistance and fracture resistance. From the same perspective, the substrate is more preferably a cemented carbide.

The substrate may have a modified surface. For example, the substrate made of a cemented carbide may have a surface on which a β-free layer is formed. Further, the substrate made of cermet may have a surface on which a cured layer is formed. Even with the substrate having a surface modified as described above, the actions and effects of the present invention are provided.

The average thickness of the entire coating layer used in the present embodiment is preferably 3.0 μm or more and 25.0 μm or less. In the coated cutting tool of the present embodiment, when the average thickness of the entire coating layer is 3.0 μm or more, the wear resistance tends to be further improved, and when the average thickness is 25.0 μm or less, the adhesion between the coating layer and the substrate is excellent, and as a result, the fracture resistance tends to be further improved. From the same perspective, the average thickness of the entire coating layer is more preferably 5.0 μm or more and 20.0 μm or less. The average thicknesses of each layer and the entire coating layer in the coated cutting tool of the present embodiment can be obtained by measuring the thickness of each layer or the thickness of the entire coating layer from a cross-sectional surface at three or more locations of each layer or the entire coating layer, and calculating the arithmetic mean thereof.

Lower Part Layer

The lower part layer used in the present embodiment is formed of a Ti oxycarbonitride layer including a compound having a composition represented by formula (1) below.

$$Ti(C_{1-x-y}N_xO_y) \qquad (1)$$

In formula (1) above, x denotes the atomic ratio of the N element based on a total of the C element, the N element, and the O element, and satisfies $0.35 \le x \le 0.60$. In the coated cutting tool of the present embodiment, as described above, the fracture resistance is improved because the atomic ratio x is 0.35 or more, and the wear resistance is improved because the atomic ratio x is 0.60 or less. In particular, the atomic ratio x is preferably 0.36 or more and 0.58 or less, more preferably 0.40 or more and 0.50 or less. The coated cutting tool of the present embodiment with the atomic ratio x falling within the above-mentioned range achieves a further excellent balance between the wear resistance and the fracture resistance, which is preferred. Further, y denotes the atomic ratio of the O element based on a total of the C element, the N element, and the O element, and satisfies $0.01 \le y \le 0.10$. In the coated cutting tool of the present embodiment, as described above, the fracture resistance is improved because the atomic ratio y is 0.01 or more and 0.10 or less. In particular, the atomic ratio y is preferably 0.02 or more and 0.08 or less, more preferably 0.03 or more and 0.07 or less. The coated cutting tool of the present embodiment with the atomic ratio y falling within the above-mentioned range achieves a further excellent balance between the wear resistance and the fracture resistance, which is preferred.

The lower part layer used in the present embodiment has an average thickness of 2.0 μm or more and 15.0 μm or less. The coated cutting tool of the present embodiment has improved wear resistance because the average thickness of the lower part layer is 2.0 μm or more. Meanwhile, the coated cutting tool of the present embodiment has improved fracture resistance because the average thickness of the lower part layer is 15.0 μm or less. From the same perspective, the average thickness of the lower part layer is preferably 3.0 μm or more and 12.0 μm or less, more preferably 5.0 μm or more and 10.0 μm or less.

The FWHM of the rocking curve of the plane (4,2,2) of the lower part layer used in the present embodiment, which is obtained through X-ray diffraction, is 20° or less (for example, 5° or more and 20° or less). The coated cutting tool of the present embodiment has improved wear resistance when the FWHM is 20° or less. From the same perspective, the FWHM is preferably 18° or less, more preferably 16° or less.

The FWHM of the rocking curve of the plane (4,2,2) of the lower part layer, which is obtained through X-ray diffraction, can be measured under the following measurement conditions. Specifically, firstly, 2θ(°) of the plane (4,2,2) of the lower part layer is identified using a general X-ray diffractometer, and the FWHM of the rocking curve is measured under the following measurement conditions.

(Measurement conditions) w: step mode, characteristic X-ray: CuKα ray, origin of 2θ: fixed value of 2θ(°) measured through X-ray diffraction, step width: 1°, measurement time: 10 sec/step, scan angle: 30° to 90°

The average particle size of the particles forming the lower part layer is preferably 0.5 μm or more and 1.5 μm or less. In the coated cutting tool of the present embodiment, when the average particle size of the particles forming the lower part layer is 0.5 μm or more, the fracture resistance tends to be further improved, and when the average particle size is 1.5 μm or less, the wear resistance tends to be further improved. Factors of these improvements are as follows. Firstly, the coated cutting tool of the present embodiment has further improved fracture resistance when the average particle size of the particles forming the lower part layer is 0.5 μm or more, mainly because cracks are prevented from being caused in a direction parallel to the surface of the substrate. Meanwhile, when a particle having a large particle size is dropped off, a recessed portion tends to be formed in the lower part layer, which leads to a fear that damage due to local wear easily develops. In view of this, it is conceivable that the coated cutting tool of the present embodiment has further improved wear resistance when the average particle size of the particles forming the lower part layer is set to 1.5 μm or less, mainly because the development of damage due to dropping off of a particle as described above is prevented. However, the present invention is by no means limited to these factors. In particular, the coated cutting tool of the present embodiment achieves a further excellent balance between the wear resistance and the fracture resistance when the average particle size of the particles forming the lower part layer is 0.8 μm or more and 1.2 μm or less, which is preferred.

The average particle size of the particles forming the lower part layer can be obtained by observing a cross-sectional structure of the lower part layer using a commercially available field emission scanning electron microscope (FE-SEM) or an electron backscatter diffraction image apparatus (EBSD), which comes with a transmission electron microscope (TEM). Specifically, a cross-sectional surface in the coated cutting tool in a direction parallel to or substantially parallel to the surface of the substrate is mirror-polished, and the obtained mirror-polished surface is used as a cross-sectional structure. Examples of a method of mirror-polishing the lower part layer can include: a polishing method with the use of diamond paste or colloidal silica; and ion milling. The cross-sectional structure of the lower part layer is set to the FE-SEM, and the sample is irradiated with an electron beam under conditions that an incident angle is 70°, an acceleration voltage is 15 kV, and an irradiation current is 0.5 nA. The sample is desirably measured in a measurement range of 30 μm×50 μm with the EBSD set to a step size of 0.1 μm. A particle is defined as a region surrounded by a structure boundary with a misorientation of 5° or more. The diameter of a circle whose area is equal to the area of a particle is defined as a particle size of such particle. Image analysis software may be used when obtaining the particle size from the cross-sectional structure of the lower part layer. The particle sizes of the lower part layer in the range of 30 μm×50 μm are measured, and the average value (arithmetic mean) of all the obtained particle sizes of the particles is defined as the average particle size.

The lower part layer used in the present embodiment is the layer formed of a Ti oxycarbonitride layer, but may contain a very few components other than a Ti oxycarbonitride as long as having the above-mentioned configuration and providing the actions and effects of the Ti oxycarbonitride layer.

Upper Part Layer

The upper part layer used in the present embodiment is formed of an α-aluminum oxide layer. The average thickness of the α-aluminum oxide layer used in the present embodiment is 1.0 μm or more and 15.0 μm or less. When the average thickness of the α-aluminum oxide layer is 1.0 μm or more, crater wear resistance in the rake surface of the coated cutting tool is improved, and when the average thickness is 15.0 μm or less, the fracture resistance of the coated cutting tool is improved mainly because the coating layer is more effectively prevented from being peeled off. From the same perspective, the average thickness of the α-aluminum oxide layer is preferably 1.5 μm or more and 12.0 μm or less, more preferably 3.0 μm or more and 10.0 μm or less.

The FWHM of the rocking curve of the plane (0,0,12) of the upper part layer used in the present embodiment, which is obtained through X-ray diffraction, is 20° or less (for example, 5° or more and 20° or less). The coated cutting tool of the present embodiment has improved wear resistance when the FWHM is 20° or less mainly because reaction wear is prevented. From the same perspective, the FWHM is preferably 18° or less, more preferably 15° or less, still more preferably 13° or less.

The FWHM of the rocking curve of the plane (0,0,12) of the upper part layer, which is obtained through X-ray diffraction, can be measured under the following measurement conditions.

The upper part layer used in the present embodiment is the layer formed of an α-aluminum oxide layer, but may contain a very few components other than an α-aluminum oxide as long as the upper part layer has the configuration used in the present embodiment and provides the actions and effects of the present invention.

Intermediate Layer

The coating layer used in the present embodiment preferably includes, between the lower part layer and the upper part layer, an intermediate layer formed of a Ti compound layer including a compound having a composition represented by formula (2) below.

$$Ti(C_{1-a-b}N_aO_b) \qquad (2)$$

In this case, the lower part layer and the upper part layer are more strongly adhered to each other via the intermediate layer, and as a result, the coated cutting tool of the present embodiment has further improved fracture resistance. In formula (2) above, a denotes the atomic ratio of the N element based on a total of the C element, the N element, and the O element, and satisfies $0.00 \leq a \leq 0.30$. The coated cutting tool of the present embodiment tends to have further improved fracture resistance when the atomic ratio a is 0.30 or less because the lower part layer and the upper part layer are more easily adhered to each other via the intermediate layer. From the same perspective, the atomic ratio a is preferably 0.25 or less, more preferably 0.22 or less. Meanwhile, the composition represented by formula (2) above may not contain nitrogen, but when the composition contains nitrogen, the coated cutting tool of the present embodiment tends to have further improved toughness. From the same perspective, the atomic ratio a is preferably 0.08 or more, more preferably 0.20 or more. Further, b denotes the atomic ratio of the O element based on a total of the C element, the N element, and the O element, and satisfies $0.01 \leq b \leq 0.10$. The coated cutting tool of the present embodiment tends to have further improved fracture resistance when the atomic ratio b is 0.01 or more mainly because the lower part layer and the upper part layer are more easily adhered to each other via the intermediate layer. The coated cutting tool of the present embodiment tends to have further improved fracture resistance when the atomic ratio b is 0.10 or less mainly because the intermediate layer has further improved strength. From the same perspective, the atomic ratio b is more preferably 0.03 or more and 0.09 or less.

The average thickness of the intermediate layer is preferably 0.05 μm or more and 1.50 μm or less. The coated cutting tool of the present embodiment has improved wear resistance because the average thickness of the intermediate layer is 0.05 μm or more. Meanwhile, the coated cutting tool of the present embodiment has improved fracture resistance mainly because the average thickness of the intermediate layer is 1.50 μm or less, and hence the coating layer is prevented from being peeled off. From the same perspective, the average thickness of the intermediate layer is more preferably 0.1 μm or more and 1.0 μm or less.

The Ti compound layer, which is the intermediate layer, is the layer formed of a Ti compound, but may contain a very few components other than a Ti compound as long as having the above-mentioned configuration and providing the actions and effects of the intermediate layer.

Lowermost Layer

The coating layer used in the present embodiment preferably is formed of a lowermost layer of a Ti nitride layer or a Ti carbide layer between the substrate and the lower part layer because the adhesion is further improved. The average thickness of the lowermost layer is preferably 0.1 μm or more and 1.5 μm or less. The adhesion is further improved when the average thickness of the lowermost layer is 0.1 μm or more because the Ti nitride layer or the Ti carbide layer has a further uniform structure, and as a result, the coated cutting tool of the present embodiment tends to have further improved fracture resistance. Meanwhile, the coated cutting tool of the present embodiment tends to have further improved fracture resistance when the average thickness of the lowermost layer is 1.5 μm or less mainly because the Ti nitride layer or the Ti carbide layer, which is the lowermost layer, is more effectively prevented from causing peeling. From the same perspective, the average thickness of the lowermost layer is more preferably 0.4 μm or more and 1.0 μm or less.

The Ti nitride layer or the Ti carbide layer, which is the lowermost layer, is the layer formed of TiN, but may contain a very few components other than a Ti nitride layer and a Ti carbide layer as long as having the above-mentioned configuration and providing the actions and effects of the lowermost layer.

Outermost Layer

The coating layer used in the present embodiment preferably includes a TiN layer of a Ti nitride layer as an outermost layer on a side opposed to the substrate as this makes it possible to confirm the usage state, such as whether or not the coated cutting tool has been used, thereby leading to excellent visibility. The average thickness of the TiN layer, which is the outermost layer, is preferably 0.2 μm or more and 5.0 μm or less. When the average thickness of the TiN layer, which is the outermost layer, is 0.2 μm or more, the particles of the α-aluminum oxide layer tend to be more effectively prevented from being dropped off, and when the average thickness is 5.0 µm or less, the coated cutting tool tends to have further improved fracture resistance. From the same perspective, the average thickness is more preferably 0.3 µm or more and 3.0 µm or less.

The Ti nitride layer, which is the outermost layer, is the layer formed of a Ti nitride, but may contain a very few components other than a Ti nitride as long as having the above-mentioned configuration and providing the actions and effects of the outermost layer.

As a method of forming each layer forming the coating layer in the coated cutting tool of the present embodiment, for example, the following methods can be given. The method of forming each layer is, however, not limited to the following.

The lowermost layer formed of a Ti nitride layer (hereinafter also referred to as the "TiN layer") can be formed by, for example, a chemical vapor deposition method with a raw material gas composition of $TiCl_4$: 5.0 mol % to 10.0 mol %, $N_2$: 20 mol % to 60 mol %, and $H_2$: the balance, a temperature of from 850° C. to 920° C., and a pressure of from 100 hPa to 400 hPa.

The lowermost layer formed of a Ti carbide layer (hereinafter also referred to as the "TiC layer") can be formed by, for example, a chemical vapor deposition method with a raw material gas composition of $TiCl_4$: 1.5 mol % to 3.5 mol %, $CH_4$: 2.0 mol % to 8.0 mol %, and $H_2$: the balance, a temperature of from 950° C. to 1,050° C., and a pressure of from 50 hPa to 100 hPa.

The lower part layer formed of a Ti oxycarbonitride layer (hereinafter also referred to as the "TiCNO layer") can be formed by, for example, a chemical vapor deposition method with a raw material gas composition of $TiCl_4$: 3.0 mol % to 15.0 mol %, $CH_3CN$: 0.5 mol % to 2.0 mol %, CO: 0.5 mol % to 2.5 mol %, $N_2$: 2.0 mol % to 10.0 mol %, and $H_2$: the balance, a temperature of from 840° C. to 950° C., and a pressure of from 60 hPa to 80 hPa.

To set the FWHM of the rocking curve of the lower part layer formed of a TiCNO layer used in the present embodiment to a predetermined value or less, for example, the amount of $CH_3CN$ that is the component of the above-mentioned raw material gas composition may be controlled. More specifically, as the composition ratio of $CH_3CN$ in the raw material gas composition increases, the FWHM of the rocking curve of the lower part layer formed of the TiCNO layer tends to decrease.

To set the average particle size of the particles forming the lower part layer formed of a TiCNO layer used in the present embodiment within a predetermined range, for example, the amount of $TiCl_4$ and the amount of $CH_3CN$ that are the components of the above-mentioned raw material gas composition may be controlled, or a temperature used in forming the lower part layer may be controlled. More specifically, the average particle size tends to decrease when the ratio ($C_{TiCl4}/C_{CH3CN}$) of the proportion of $TiCl_4$ ($C_{TiCl4}$ (mol %)) in the raw material gas composition to the proportion of $CH_3CN$ ($C_{CH3CN}$ (mol %)) in the raw material gas composition increases, or a formation temperature decreases.

The intermediate layer formed of a Ti compound layer can be formed by, when the Ti compound layer is a TiCNO layer, for example, a chemical vapor deposition method with a raw material gas composition of $TiCl_4$: 2.0 mol % to 5.0 mol %, $CH_4$: 0.5 mol % to 1.5 mol %, CO: 0.4 mol % to 2.5 mol %, $N_2$: 0.5 mol % to 2.5 mol %, and $H_2$: the balance, a temperature of from 975° C. to 1,025° C., and a pressure of from 60 hPa to 100 hPa.

The intermediate layer formed of a Ti compound layer can be formed by, when the Ti compound layer is a TiCO layer, for example, a chemical vapor deposition method with a raw material gas composition of $TiCl_4$: 2.0 mol % to 3.0 mol %, CO: 1.0 mol % to 3.0 mol %, and $H_2$: the balance, a temperature of from 975° C. to 1,025° C., and a pressure of from 60 hPa to 100 hPa.

The upper part layer formed of an α-aluminum oxide layer can be obtained by the following method, for example.

Firstly, before the upper part layer is formed, the surface of a layer farthest from the substrate is oxidized (oxidation process). The farthest layer is, for example, the intermediate layer when the intermediate layer is formed on the lower part layer, and is the lower part layer when the intermediate layer is not formed on the lower part layer. Thereafter, the nucleus of an α-aluminum oxide layer is formed on the surface of the layer farthest from the substrate (nucleus formation process), and the α-aluminum oxide layer is formed with the formed nucleus (deposition process).

More specifically, the surface of the above-mentioned layer farthest from the substrate is oxidized under conditions that a gas composition is $CO_2$: 0.1 mol % to 1.0 mol % and $H_2$: the balance, a temperature is from 850° C. to 1,150° C., and a pressure is from 45 hPa to 65 hPa. Here, the oxidation time is preferably from 1 minute to 5 minutes.

Thereafter, the nucleus of the α-aluminum oxide layer is formed by a chemical vapor deposition method with a raw material gas composition of $AlCl_3$: 1.0 mol % to 3.5 mol %, CO: 0.5 mol % to 2.5 mol %, $CO_2$: 0.5 mol % to 4.0 mol %, HCl: 1.5 mol % to 3.5 mol %, and $H_2$: the balance, a temperature of from 850° C. to 950° C., and a pressure of from 60 hPa to 80 hPa.

Then, the upper part layer formed of the α-aluminum oxide layer is formed by a chemical vapor deposition method with a raw material gas composition of $AlCl_3$: 2.0 mol % to 5.0 mol %, $CO_2$: 2.0 mol % to 5.0 mol %, HCl: 2.0 mol % to 3.0 mol %, $H_2S$: 0.15 mol % to 0.25 mol %, and $H_2$: the balance, a temperature of from 900° C. to 1,100° C., and a pressure of from 60 hPa to 80 hPa.

To give a crystal oriented to the plane (0,0,12) to the upper part layer formed of an α-aluminum oxide layer used in the present embodiment, a temperature may be controlled or the amount of CO that is the component of the raw material gas composition may be controlled in the nucleus formation process. More specifically, in the nucleus formation process, when the temperature decreases or the composition ratio of CO of the raw material gas composition decreases, the α-aluminum oxide layer tends to have a crystal oriented to the plane (0,0,12).

To set the FWHM of the rocking curve of the upper part layer formed of an α-aluminum oxide layer used in the present embodiment to a predetermined value or less, the oxidation time may be controlled in the oxidation process, or the amount of $CO_2$ that is the component of the raw material gas composition may be controlled in the deposition process. More specifically, when the oxidation time increases in the oxidation process, or the ratio of $CO_2$ (mol %) in the raw material gas composition decreases in the deposition process, the upper part layer of an α-aluminum oxide layer tends to have a small FWHM of the rocking curve.

Similarly to the above-mentioned lowermost layer, the outermost layer formed of a Ti nitride layer (TiN layer) can be formed by a chemical vapor deposition method with a raw material gas composition of $TiCl_4$: 5.0 mol % to 10.0 mol %, $N_2$: 20 mol % to 60 mol %, and $H_2$: the balance, a temperature of from 850° C. to 1,050° C., and a pressure of from 100 hPa to 400 hPa.

The thickness of each layer of the coating layer used in the coated cutting tool of the present embodiment can be measured by observing a cross-sectional structure of the coated cutting tool using an optical microscope, a scanning electron microscope (SEM), or an FE-SEM, for example. The average thickness of each layer in the coated cutting tool of the present embodiment can be obtained by measuring the thickness of each layer at three or more locations near the position 50 μm from the edge, toward the center of the rake surface of the coated cutting tool, and calculating the arithmetic mean thereof. Further, the composition of each layer can be measured from a cross-sectional structure of the coated cutting tool of the present embodiment, using an energy dispersive X-ray spectroscope (EDS), a wavelength dispersive X-ray spectroscope (WDS), or the like.

EXAMPLE

Now, the present invention is more specifically described by means of Examples, but the present invention is not limited to Examples.

Two types of substrates were prepared. That is, a cemented carbide cutting insert with a shape of JIS certified CNMG120412 and a composition of 88.7WC-8.0Co-1.5TiN-1.5NbC-0.3$Cr_3C_2$ (mass %) (hereinafter sometimes referred to as "substrate 1"), and a cemented carbide cutting insert with a shape of JIS certified CNMG120412 and a composition of 89.7WC-7.0Co-1.5TiN-1.5NbC-0.1 $Cr_3C_2$ (mass %) (hereinafter referred to as "substrate 2"). The edge of each substrate was subjected to round honing by means of an SiC brush, and the surface of each substrate was then washed.

After the surface of each substrate was washed, a coating layer was formed by a chemical vapor deposition method. As to invention samples 1 to 30, firstly, each substrate was inserted into an external heating chemical vapor deposition apparatus, and a lowermost layer having a composition shown in Table 10 was formed on the surface of each substrate so as to have an average thickness shown in Table 10 under raw material gas composition, temperature, and pressure conditions shown in Table 1. Then, a Ti oxycarbonitride layer (lower part layer) having a composition shown in Table 10 was formed on the surface of the lowermost layer so as to have an average thickness shown in Table 10 under raw material gas composition, temperature, and pressure conditions shown in Table 2. Next, an intermediate layer having a composition shown in Table 10 was formed on the surface of the Ti oxycarbonitride layer (lower part layer) so as to have an average thickness shown in Table 10 under raw material gas composition, temperature, and pressure conditions shown in Table 4. Thereafter, the surface of the intermediate layer was oxidized for time shown in Table 6, under gas composition, temperature, and pressure conditions shown in Table 6. Then, the nucleus of an α-aluminum oxide was formed on the oxidized surface of the intermediate layer under raw material gas composition, temperature, and pressure conditions concerning the "nucleus formation process" shown in Table 8. Further, an α-aluminum oxide layer (upper part layer) having a composition shown in Table 10 was formed on the surface of the intermediate layer and the surface of the nucleus of the α-aluminum oxide so as to have an average thickness shown in Table 10 under raw material gas composition, temperature, and pressure conditions concerning the "deposition process" shown in Table 8. Lastly, an outermost layer having a composition shown in Table 10 was formed on the surface of the α-aluminum oxide layer (upper part layer) so as to have an average thickness shown in Table 10 under raw material gas composition, temperature, and pressure conditions shown in Table 1. As a result, the coated cutting tools of invention samples 1 to 30 were obtained.

Meanwhile, as to comparative samples 1 to 10, firstly, each substrate was inserted into an external heating chemical vapor deposition apparatus, and a lowermost layer having a composition shown in Table 11 was formed on the surface of each substrate so as to have an average thickness shown in Table 11 under raw material gas composition, temperature, and pressure conditions shown in Table 1. Then, a TiCN layer or a TiCNO layer (lower part layer) having a composition shown in Table 11 was formed on the surface of the lowermost layer so as to have an average thickness shown in Table 11 under raw material gas composition, temperature, and pressure conditions shown in Table 3. Next, an intermediate layer having a composition shown in Table 11 was formed on the surface of the lower part layer so as to have an average thickness shown in Table 11 under raw material gas composition, temperature, and pressure conditions shown in Table 5. Thereafter, the surface of the intermediate layer was oxidized for time shown in Table 7, under gas composition, temperature, and pressure conditions shown in Table 7. Then, the nucleus of an α-aluminum oxide was formed on the oxidized surface of the intermediate layer under raw material gas composition, temperature, and pressure conditions concerning the "nucleus formation process" shown in Table 9. Further, an α-aluminum oxide layer (upper part layer) having a composition shown in Table 11 was formed on the surface of the intermediate layer and the surface of the nucleus of the α-aluminum oxide so as to have an average thickness shown in Table 11 under raw material gas composition, temperature, and pressure conditions concerning the "deposition process" shown in Table 9. Lastly, an outermost layer having a composition shown in Table 11 was formed on the surface of the α-aluminum oxide layer (upper part layer) so as to have an average thickness shown in Table 11 under raw material gas composition, temperature, and pressure conditions shown in Table 1. As a result, the coated cutting tools of comparative samples 1 to 10 were obtained.

The coating layer was formed on each of the two types of substrates (substrate 1 and substrate 2) by the chemical vapor deposition method, but no difference in characteristics of the coating layer was observed between the different substrate types. Thus, each item in Tables regarding invention samples 1 to 30 and comparative samples 1 to 10 includes both a case where the coating layer was formed on substrate 1 and a case where the coating layer was formed on substrate 2.

The thickness of each layer of each of the samples was obtained as set forth below. That is, using an FE-SEM, the average thickness was obtained by measuring the thickness of each layer, from each of cross-sectional surfaces at three locations near the position 50 μm from the edge of the coated cutting tool, toward the center of the rake surface thereof, and calculating the arithmetic mean thereof. Using an EDS, the composition of each layer of the obtained sample was measured from a cross-sectional surface near the position at most 50 μm from the edge of the coated cutting tool, toward the center of the rake surface thereof.

TABLE 1

| Composition of each layer | Temperature (° C.) | Pressure (hPa) | Raw material composition (mol %) |
|---|---|---|---|
| TiN (lowermost layer) | 900 | 350 | TiCl$_4$: 7.5%, N$_2$: 40.0%, H$_2$: 52.5% |
| TiC (lowermost layer) | 1,000 | 75 | TiCl$_4$: 2.4%, CH$_4$: 4.6%, H$_2$: 93.0% |
| TiN (outermost layer) | 1,000 | 350 | TiCl$_4$: 7.5%, N$_2$: 40.0%, H$_2$: 52.5% |

TABLE 2

| | | | Lower part layer | | | | | |
|---|---|---|---|---|---|---|---|---|
| | | | Raw material composition (mol %) | | | | | |
| Sample No. | Temperature (° C.) | Pressure (hPa) | TiCl$_4$ | CH$_3$CN | C$_2$H$_6$ | CO | N$_2$ | H$_2$ |
| Invention sample 1 | 880 | 70 | 8.0 | 1.0 | 0.0 | 1.5 | 5.0 | 84.5 |
| Invention sample 2 | 880 | 70 | 12.0 | 1.5 | 0.0 | 1.5 | 5.0 | 80.0 |
| Invention sample 3 | 880 | 70 | 5.5 | 0.7 | 0.0 | 1.5 | 5.0 | 87.3 |
| Invention sample 4 | 880 | 70 | 8.0 | 1.0 | 0.0 | 1.5 | 5.0 | 84.5 |
| Invention sample 5 | 880 | 70 | 8.0 | 1.0 | 0.0 | 1.5 | 5.0 | 84.5 |
| Invention sample 6 | 880 | 70 | 8.0 | 1.0 | 0.0 | 0.7 | 3.0 | 87.3 |
| Invention sample 7 | 880 | 70 | 8.0 | 1.0 | 0.0 | 2.0 | 8.0 | 81.0 |
| Invention sample 8 | 880 | 70 | 8.0 | 1.0 | 0.0 | 1.5 | 5.0 | 84.5 |
| Invention sample 9 | 880 | 70 | 8.0 | 1.0 | 0.0 | 1.5 | 5.0 | 84.5 |
| Invention sample 10 | 920 | 70 | 8.0 | 1.0 | 0.0 | 1.5 | 5.0 | 84.5 |
| Invention sample 11 | 850 | 70 | 8.0 | 1.0 | 0.0 | 1.5 | 5.0 | 84.5 |
| Invention sample 12 | 880 | 70 | 8.0 | 1.0 | 0.0 | 1.5 | 5.0 | 84.5 |
| Invention sample 13 | 880 | 70 | 8.0 | 1.0 | 0.0 | 1.5 | 5.0 | 84.5 |
| Invention sample 14 | 880 | 70 | 8.0 | 1.0 | 0.0 | 2.0 | 8.0 | 81.0 |
| Invention sample 15 | 880 | 70 | 8.0 | 1.0 | 0.0 | 2.0 | 8.0 | 81.0 |
| Invention sample 16 | 880 | 70 | 12.0 | 1.5 | 0.0 | 1.5 | 5.0 | 80.0 |
| Invention sample 17 | 880 | 70 | 8.0 | 1.0 | 0.0 | 0.7 | 3.0 | 87.3 |
| Invention sample 18 | 880 | 70 | 8.0 | 1.2 | 0.0 | 0.7 | 3.0 | 87.1 |
| Invention sample 19 | 850 | 70 | 9.5 | 1.2 | 0.0 | 0.7 | 3.0 | 85.6 |
| Invention sample 20 | 850 | 70 | 9.5 | 1.2 | 0.0 | 2.0 | 8.0 | 79.3 |
| Invention sample 21 | 880 | 70 | 8.0 | 1.0 | 0.0 | 1.5 | 5.0 | 84.5 |
| Invention sample 22 | 880 | 70 | 8.0 | 1.0 | 0.0 | 1.5 | 5.0 | 84.5 |
| Invention sample 23 | 880 | 70 | 8.0 | 1.0 | 0.0 | 1.5 | 5.0 | 84.5 |
| Invention sample 24 | 880 | 70 | 4.7 | 0.7 | 0.0 | 2.3 | 5.0 | 87.3 |
| Invention sample 25 | 880 | 70 | 4.7 | 0.7 | 0.0 | 2.3 | 5.0 | 87.3 |
| Invention sample 26 | 880 | 70 | 12.0 | 1.5 | 0.0 | 2.3 | 5.0 | 79.2 |
| Invention sample 27 | 880 | 70 | 8.0 | 1.0 | 0.0 | 2.3 | 5.0 | 83.7 |
| Invention sample 28 | 880 | 70 | 8.0 | 1.0 | 0.0 | 2.3 | 5.0 | 83.7 |
| Invention sample 29 | 880 | 70 | 8.0 | 1.0 | 0.0 | 2.3 | 5.0 | 83.7 |
| Invention sample 30 | 880 | 70 | 8.0 | 1.0 | 0.0 | 2.3 | 5.0 | 83.7 |

TABLE 3

| | | | Lower part layer | | | | | |
|---|---|---|---|---|---|---|---|---|
| | Temperature | Pressure | Raw material composition (mol %) | | | | | |
| Sample No. | (° C.) | (hPa) | $TiCl_4$ | $CH_3CN$ | $C_2H_6$ | CO | $N_2$ | $H_2$ |
| Comparative sample 1 | 880 | 70 | 4.0 | 0.5 | 0.0 | 0.0 | 0.0 | 95.5 |
| Comparative sample 2 | 880 | 70 | 8.0 | 1.0 | 0.0 | 0.0 | 0.0 | 91.0 |
| Comparative sample 3 | 880 | 70 | 4.0 | 0.5 | 0.0 | 1.5 | 5.0 | 89.0 |
| Comparative sample 4 | 880 | 70 | 8.0 | 1.0 | 0.0 | 1.5 | 5.0 | 84.5 |
| Comparative sample 5 | 880 | 70 | 8.0 | 1.0 | 0.0 | 1.5 | 5.0 | 84.5 |
| Comparative sample 6 | 880 | 70 | 4.0 | 0.5 | 0.0 | 2.0 | 8.0 | 85.5 |
| Comparative sample 7 | 880 | 70 | 4.0 | 0.5 | 0.0 | 2.3 | 5.0 | 88.2 |
| Comparative sample 8 | 920 | 70 | 8.0 | 0.0 | 0.7 | 0.0 | 20.0 | 71.3 |
| Comparative sample 9 | 920 | 70 | 8.0 | 0.0 | 0.7 | 0.0 | 20.0 | 71.3 |
| Comparative sample 10 | 880 | 70 | 4.0 | 0.5 | 0.0 | 0.0 | 0.0 | 95.5 |

TABLE 4

| | | | Intermediate layer | | | | |
|---|---|---|---|---|---|---|---|
| | Temperature | Pressure | Raw material composition (mol %) | | | | |
| Sample No. | (° C.) | (hPa) | $TiCl_4$ | $CH_4$ | CO | $N_2$ | $H_2$ |
| Invention sample 1 | 1,000 | 80 | 3.8 | 1.1 | 0.8 | 1.0 | 93.3 |
| Invention sample 2 | 1,000 | 80 | 3.8 | 1.1 | 0.8 | 1.0 | 93.3 |
| Invention sample 3 | 1,000 | 80 | 3.8 | 1.1 | 0.8 | 1.0 | 93.3 |
| Invention sample 4 | 1,000 | 80 | 3.8 | 1.1 | 0.8 | 1.0 | 93.3 |
| Invention sample 5 | 1,000 | 80 | 3.8 | 1.1 | 0.8 | 1.0 | 93.3 |
| Invention sample 6 | 1,000 | 80 | 3.8 | 1.1 | 0.8 | 1.0 | 93.3 |
| Invention sample 7 | 1,000 | 80 | 3.8 | 1.1 | 0.8 | 1.0 | 93.3 |
| Invention sample 8 | 1,000 | 80 | 3.8 | 1.3 | 1.3 | 0.5 | 93.1 |
| Invention sample 9 | 1,000 | 80 | 3.8 | 1.1 | 0.4 | 1.3 | 93.4 |
| Invention sample 10 | 1,000 | 80 | 3.8 | 1.1 | 0.8 | 1.0 | 93.3 |
| Invention sample 11 | 1,000 | 80 | 3.8 | 1.1 | 0.8 | 1.0 | 93.3 |
| Invention sample 12 | 1,000 | 80 | 3.8 | 1.1 | 0.8 | 1.0 | 93.3 |
| Invention sample 13 | 1,000 | 80 | 3.8 | 1.1 | 0.8 | 1.0 | 93.3 |
| Invention sample 14 | 1,000 | 80 | 3.8 | 1.1 | 0.8 | 1.0 | 93.3 |
| Invention sample 15 | 1,000 | 80 | 3.8 | 1.1 | 0.8 | 1.0 | 93.3 |
| Invention sample 16 | 1,000 | 80 | 3.8 | 1.1 | 0.8 | 1.0 | 93.3 |
| Invention sample 17 | 1,000 | 80 | 2.4 | 0.0 | 2.0 | 0.0 | 95.6 |
| Invention sample 18 | 1,000 | 80 | 3.8 | 1.1 | 0.8 | 1.0 | 93.3 |
| Invention sample 19 | 1,000 | 80 | 3.8 | 1.1 | 0.8 | 1.0 | 93.3 |
| Invention sample 20 | 1,000 | 80 | 3.8 | 1.1 | 0.8 | 1.0 | 93.3 |
| Invention sample 21 | 1,000 | 80 | 3.8 | 1.1 | 0.8 | 1.0 | 93.3 |
| Invention sample 22 | 1,000 | 80 | 3.8 | 1.1 | 0.8 | 1.0 | 93.3 |
| Invention sample 23 | 1,000 | 80 | 2.4 | 0.0 | 2.0 | 0.0 | 95.6 |
| Invention sample 24 | 1,000 | 80 | 3.8 | 0.8 | 1.7 | 2.0 | 91.7 |
| Invention sample 25 | 1,000 | 80 | 3.8 | 0.8 | 1.7 | 2.0 | 91.7 |
| Invention sample 26 | 1,000 | 80 | 3.8 | 0.8 | 1.7 | 2.0 | 91.7 |
| Invention sample 27 | 1,000 | 80 | 3.8 | 1.1 | 0.8 | 1.0 | 93.3 |
| Invention sample 28 | 1,000 | 80 | 3.8 | 0.8 | 1.7 | 2.0 | 91.7 |
| Invention sample 29 | 1,000 | 80 | 3.8 | 0.8 | 1.7 | 2.0 | 91.7 |
| Invention sample 30 | 1,000 | 80 | 3.8 | 0.8 | 1.7 | 2.0 | 91.7 |

TABLE 5

| | | | Intermediate layer | | | | |
|---|---|---|---|---|---|---|---|
| | Temperature | Pressure | Raw material composition (mol %) | | | | |
| Sample No. | (° C.) | (hPa) | $TiCl_4$ | $CH_4$ | CO | $N_2$ | $H_2$ |
| Comparative sample 1 | 1,000 | 80 | 3.8 | 1.1 | 0.8 | 1.0 | 93.3 |
| Comparative sample 2 | 1,000 | 80 | 3.8 | 1.1 | 0.8 | 1.0 | 93.3 |

TABLE 5-continued

| | Intermediate layer | | | | | | |
|---|---|---|---|---|---|---|---|
| | Temperature | Pressure | Raw material composition (mol %) | | | | |
| Sample No. | (° C.) | (hPa) | TiCl$_4$ | CH$_4$ | CO | N$_2$ | H$_2$ |
| Comparative sample 3 | 1,000 | 80 | 3.8 | 1.1 | 0.8 | 1.0 | 93.3 |
| Comparative sample 4 | 1,000 | 80 | 3.8 | 1.1 | 0.8 | 1.0 | 93.3 |
| Comparative sample 5 | 1,000 | 80 | 3.8 | 1.1 | 0.8 | 1.0 | 93.3 |
| Comparative sample 6 | 1,000 | 80 | 3.8 | 1.1 | 0.8 | 1.0 | 93.3 |
| Comparative sample 7 | 1,000 | 80 | 3.8 | 0.8 | 1.7 | 1.0 | 92.7 |
| Comparative sample 8 | 1,000 | 80 | 3.8 | 1.1 | 0.8 | 1.0 | 93.3 |
| Comparative sample 9 | 1,000 | 80 | 3.8 | 0.8 | 1.7 | 1.0 | 92.7 |
| Comparative sample 10 | 1,000 | 80 | 2.4 | 0.0 | 2.0 | 0.0 | 95.6 |

TABLE 6

| | Oxidation | | | | |
|---|---|---|---|---|---|
| | Temperature | Pressure | Gas composition (mol %) | | Time |
| Sample No. | (° C.) | (hPa) | CO$_2$ | H$_2$ | (min) |
| Invention sample 1 | 1,000 | 55 | 0.3 | 99.7 | 2 |
| Invention sample 2 | 1,000 | 55 | 0.3 | 99.7 | 2 |
| Invention sample 3 | 1,000 | 55 | 0.3 | 99.7 | 2 |
| Invention sample 4 | 1,000 | 55 | 0.3 | 99.7 | 3 |
| Invention sample 5 | 1,000 | 55 | 0.3 | 99.7 | 1 |
| Invention sample 6 | 1,000 | 55 | 0.3 | 99.7 | 2 |
| Invention sample 7 | 1,000 | 55 | 0.3 | 99.7 | 2 |
| Invention sample 8 | 1,000 | 55 | 0.3 | 99.7 | 2 |
| Invention sample 9 | 1,000 | 55 | 0.3 | 99.7 | 2 |
| Invention sample 10 | 1,000 | 55 | 0.3 | 99.7 | 2 |
| Invention sample 11 | 1,000 | 55 | 0.3 | 99.7 | 2 |
| Invention sample 12 | 1,000 | 55 | 0.3 | 99.7 | 2 |
| Invention sample 13 | 1,000 | 55 | 0.3 | 99.7 | 2 |
| Invention sample 14 | 1,000 | 55 | 0.3 | 99.7 | 2 |
| Invention sample 15 | 1,000 | 55 | 0.3 | 99.7 | 2 |
| Invention sample 16 | 1,000 | 55 | 0.3 | 99.7 | 3 |
| Invention sample 17 | 1,000 | 55 | 0.3 | 99.7 | 2 |
| Invention sample 18 | 1,000 | 55 | 0.3 | 99.7 | 2 |
| Invention sample 19 | 1,000 | 55 | 0.3 | 99.7 | 2 |
| Invention sample 20 | 1,000 | 55 | 0.3 | 99.7 | 2 |
| Invention sample 21 | 1,000 | 55 | 0.3 | 99.7 | 2 |
| Invention sample 22 | 1,000 | 55 | 0.3 | 99.7 | 2 |
| Invention sample 23 | 1,000 | 55 | 0.3 | 99.7 | 2 |
| Invention sample 24 | 1,000 | 55 | 0.3 | 99.7 | 1 |
| Invention sample 25 | 1,000 | 55 | 0.3 | 99.7 | 1 |
| Invention sample 26 | 1,000 | 55 | 0.3 | 99.7 | 1 |
| Invention sample 27 | 1,000 | 55 | 0.3 | 99.7 | 1 |
| Invention sample 28 | 1,000 | 55 | 0.3 | 99.7 | 1 |
| Invention sample 29 | 1,000 | 55 | 0.3 | 99.7 | 1 |
| Invention sample 30 | 1,000 | 55 | 0.3 | 99.7 | 1 |

TABLE 7

| | Oxidation | | | | |
|---|---|---|---|---|---|
| | Temperature | Pressure | Gas composition (mol %) | | Time |
| Sample No. | (° C.) | (hPa) | CO$_2$ | H$_2$ | (min) |
| Comparative sample 1 | 1,000 | 55 | 0.3 | 99.7 | 2 |
| Comparative sample 2 | 1,000 | 55 | 0.3 | 99.7 | 2 |
| Comparative sample 3 | 1,000 | 55 | 0.3 | 99.7 | 2 |
| Comparative sample 4 | 1,000 | 55 | 0.3 | 99.7 | 1 |
| Comparative sample 5 | 1,000 | 55 | 0.3 | 99.7 | 2 |
| Comparative sample 6 | 1,000 | 55 | 0.3 | 99.7 | 1 |
| Comparative sample 7 | 1,000 | 55 | 0.3 | 99.7 | 1 |
| Comparative sample 8 | 1,000 | 55 | 0.3 | 99.7 | 2 |
| Comparative sample 9 | 1,000 | 55 | 0.3 | 99.7 | 2 |
| Comparative sample 10 | 1,000 | 55 | 0.3 | 99.7 | 2 |

TABLE 8

| | Upper part layer (nucleus formation process) | | | | | | | Upper part layer (deposition process) | | | | | | |
|---|---|---|---|---|---|---|---|---|---|---|---|---|---|---|
| | Temperature | Pressure | Raw material composition (mol %) | | | | | Temperature | Pressure | Raw material composition (mol %) | | | | |
| Sample No. | (° C.) | (hPa) | AlCl$_3$ | CO | CO$_2$ | HCl | H$_2$ | (° C.) | (hPa) | AlCl$_3$ | CO$_2$ | HCl | H$_2$S | H$_2$ |
| Invention sample 1 | 920 | 70 | 2.5 | 1.0 | 2.0 | 2.5 | 92.0 | 990 | 70 | 3.0 | 3.0 | 2.5 | 0.20 | 91.3 |
| Invention sample 2 | 920 | 70 | 2.5 | 1.0 | 2.0 | 2.5 | 92.0 | 990 | 70 | 3.0 | 3.0 | 2.5 | 0.20 | 91.3 |
| Invention sample 3 | 920 | 70 | 2.5 | 1.0 | 2.0 | 2.5 | 92.0 | 990 | 70 | 3.0 | 3.0 | 2.5 | 0.20 | 91.3 |
| Invention sample 4 | 920 | 70 | 2.5 | 1.0 | 3.0 | 2.5 | 91.0 | 990 | 70 | 3.0 | 2.5 | 2.5 | 0.20 | 91.8 |
| Invention sample 5 | 920 | 70 | 2.5 | 1.0 | 1.0 | 2.5 | 93.0 | 990 | 70 | 3.0 | 4.0 | 2.5 | 0.20 | 90.3 |
| Invention sample 6 | 920 | 70 | 2.5 | 1.0 | 1.0 | 2.5 | 93.0 | 990 | 70 | 3.0 | 3.0 | 2.5 | 0.20 | 91.3 |
| Invention sample 7 | 890 | 70 | 2.5 | 1.0 | 1.0 | 2.5 | 93.0 | 960 | 70 | 3.0 | 3.0 | 2.5 | 0.20 | 91.3 |
| Invention sample 8 | 920 | 70 | 2.5 | 1.0 | 1.0 | 2.0 | 93.5 | 990 | 70 | 3.0 | 3.0 | 2.0 | 0.20 | 91.8 |
| Invention sample 9 | 920 | 70 | 2.5 | 1.0 | 1.0 | 2.5 | 93.0 | 990 | 70 | 3.0 | 3.0 | 2.5 | 0.20 | 91.3 |

TABLE 8-continued

| | Upper part layer (nucleus formation process) | | | | | | | Upper part layer (deposition process) | | | | | | |
|---|---|---|---|---|---|---|---|---|---|---|---|---|---|---|
| | Temperature | Pressure | Raw material composition (mol %) | | | | | Temperature | Pressure | Raw material composition (mol %) | | | | |
| Sample No. | (° C.) | (hPa) | $AlCl_3$ | CO | $CO_2$ | HCl | $H_2$ | (° C.) | (hPa) | $AlCl_3$ | $CO_2$ | HCl | $H_2S$ | $H_2$ |
| Invention sample 10 | 920 | 70 | 2.5 | 1.0 | 1.0 | 3.0 | 92.5 | 990 | 70 | 3.0 | 3.0 | 3.0 | 0.20 | 90.8 |
| Invention sample 11 | 920 | 70 | 2.5 | 1.0 | 1.0 | 2.5 | 93.0 | 990 | 70 | 3.0 | 3.0 | 2.5 | 0.20 | 91.3 |
| Invention sample 12 | 920 | 70 | 2.5 | 1.0 | 1.0 | 2.5 | 93.0 | 990 | 70 | 3.0 | 3.0 | 2.5 | 0.20 | 91.3 |
| Invention sample 13 | 920 | 70 | 2.5 | 1.0 | 1.0 | 2.5 | 93.0 | 990 | 70 | 3.0 | 3.0 | 2.5 | 0.20 | 91.3 |
| Invention sample 14 | 920 | 70 | 2.5 | 1.0 | 1.0 | 2.5 | 93.0 | 990 | 70 | 3.0 | 3.0 | 2.5 | 0.20 | 91.3 |
| Invention sample 15 | 920 | 70 | 2.5 | 1.0 | 1.0 | 2.5 | 93.0 | 990 | 70 | 3.0 | 3.0 | 2.5 | 0.20 | 91.3 |
| Invention sample 16 | 920 | 70 | 2.5 | 1.0 | 1.0 | 2.5 | 93.0 | 990 | 70 | 3.0 | 2.5 | 2.5 | 0.20 | 91.8 |
| Invention sample 17 | 920 | 70 | 2.5 | 1.0 | 1.0 | 2.5 | 93.0 | 990 | 70 | 3.0 | 3.0 | 2.5 | 0.20 | 91.3 |
| Invention sample 18 | 920 | 70 | 2.5 | 1.0 | 1.0 | 2.5 | 93.0 | 990 | 70 | 3.0 | 3.0 | 2.5 | 0.20 | 91.3 |
| Invention sample 19 | 920 | 70 | 2.5 | 1.0 | 1.0 | 2.5 | 93.0 | 990 | 70 | 3.0 | 3.0 | 2.5 | 0.20 | 91.3 |
| Invention sample 20 | 920 | 70 | 2.5 | 1.0 | 1.0 | 2.5 | 93.0 | 990 | 70 | 3.0 | 3.0 | 2.5 | 0.20 | 91.3 |
| Invention sample 21 | 920 | 70 | 2.5 | 1.0 | 1.0 | 2.5 | 93.0 | 990 | 70 | 3.0 | 3.0 | 2.5 | 0.20 | 91.3 |
| Invention sample 22 | 920 | 70 | 3.5 | 1.0 | 1.0 | 2.5 | 92.0 | 990 | 70 | 3.0 | 3.0 | 2.5 | 0.20 | 91.4 |
| Invention sample 23 | 920 | 70 | 2.5 | 1.0 | 1.0 | 2.5 | 93.0 | 990 | 70 | 3.0 | 3.0 | 2.5 | 0.20 | 91.3 |
| Invention sample 24 | 920 | 70 | 2.5 | 1.0 | 1.0 | 2.5 | 93.0 | 990 | 70 | 3.0 | 4.0 | 2.5 | 0.20 | 90.3 |
| Invention sample 25 | 920 | 70 | 2.5 | 1.0 | 1.0 | 2.5 | 93.0 | 990 | 70 | 3.0 | 4.0 | 2.5 | 0.20 | 90.3 |
| Invention sample 26 | 920 | 70 | 2.5 | 1.0 | 1.0 | 2.5 | 93.0 | 990 | 70 | 3.0 | 4.0 | 2.5 | 0.20 | 90.3 |
| Invention sample 27 | 920 | 70 | 2.5 | 1.0 | 1.0 | 2.5 | 93.0 | 990 | 70 | 3.0 | 4.0 | 2.5 | 0.20 | 90.3 |
| Invention sample 28 | 920 | 70 | 2.5 | 2.0 | 1.0 | 2.5 | 92.0 | 990 | 70 | 4.0 | 4.0 | 2.5 | 0.20 | 89.3 |
| Invention sample 29 | 920 | 70 | 2.5 | 1.0 | 1.0 | 2.5 | 93.0 | 990 | 70 | 3.0 | 4.0 | 2.5 | 0.20 | 90.3 |
| Invention sample 30 | 920 | 70 | 1.5 | 1.0 | 1.0 | 2.5 | 94.0 | 990 | 70 | 2.0 | 4.0 | 2.5 | 0.20 | 91.3 |

TABLE 9

| | Upper part layer (nucleus formation process) | | | | | | | Upper part layer (deposition process) | | | | | | |
|---|---|---|---|---|---|---|---|---|---|---|---|---|---|---|
| | Temperature | Pressure | Raw material composition (mol %) | | | | | Temperature | Pressure | Raw material composition (mol %) | | | | |
| Sample No. | (° C.) | (hPa) | $AlCl_3$ | CO | $CO_2$ | HCl | $H_2$ | (° C.) | (hPa) | $AlCl_3$ | $CO_2$ | HCl | $H_2S$ | $H_2$ |
| Comparative sample 1 | 920 | 70 | 2.5 | 1.0 | 1.0 | 2.5 | 93.0 | 990 | 70 | 3.0 | 3.0 | 2.5 | 0.20 | 91.3 |
| Comparative sample 2 | 920 | 70 | 2.5 | 1.0 | 1.0 | 2.5 | 93.0 | 990 | 70 | 3.0 | 3.0 | 2.5 | 0.20 | 91.3 |
| Comparative sample 3 | 920 | 70 | 2.5 | 1.0 | 1.0 | 2.5 | 93.0 | 990 | 70 | 3.0 | 3.0 | 2.5 | 0.20 | 91.3 |
| Comparative sample 4 | 920 | 70 | 2.5 | 1.0 | 1.0 | 2.5 | 93.0 | 990 | 70 | 3.0 | 5.0 | 2.5 | 0.20 | 89.3 |
| Comparative sample 5 | 920 | 70 | 2.5 | 1.0 | 1.0 | 2.5 | 93.0 | 990 | 70 | 3.0 | 3.0 | 2.5 | 0.20 | 91.3 |
| Comparative sample 6 | 920 | 70 | 2.5 | 1.0 | 1.0 | 2.5 | 93.0 | 990 | 70 | 3.0 | 5.0 | 2.5 | 0.20 | 89.3 |
| Comparative sample 7 | 920 | 70 | 2.5 | 1.0 | 1.0 | 2.5 | 93.0 | 990 | 70 | 3.0 | 5.0 | 2.5 | 0.20 | 89.3 |

TABLE 9-continued

| | Upper part layer (nucleus formation process) | | | | | | | Upper part layer (deposition process) | | | | | | |
|---|---|---|---|---|---|---|---|---|---|---|---|---|---|---|
| | Temperature | Pressure | Raw material composition (mol %) | | | | | Temperature | Pressure | Raw material composition (mol %) | | | | |
| Sample No. | (° C.) | (hPa) | $AlCl_3$ | CO | $CO_2$ | HCl | $H_2$ | (° C.) | (hPa) | $AlCl_3$ | $CO_2$ | HCl | $H_2S$ | $H_2$ |
| Comparative sample 8 | 920 | 70 | 2.5 | 1.0 | 1.0 | 2.5 | 93.0 | 990 | 70 | 3.0 | 5.0 | 2.5 | 0.20 | 89.3 |
| Comparative sample 9 | 920 | 70 | 2.5 | 1.0 | 1.0 | 2.5 | 93.0 | 990 | 70 | 3.0 | 5.0 | 2.5 | 0.20 | 89.3 |
| Comparative sample 10 | 920 | 70 | 2.5 | 1.0 | 1.0 | 2.5 | 93.0 | 990 | 70 | 3.0 | 3.0 | 2.5 | 0.20 | 91.3 |

TABLE 10

| | Coating layer | | | | | | | | | | Thickness of entire coating layer (μm) |
|---|---|---|---|---|---|---|---|---|---|---|---|
| | Lowermost layer | | Lower part layer | | Intermediate layer | | Upper part layer | | | Outermost layer | |
| Sample No. | Composition | Average thickness (μm) | Composition | Average thickness (μm) | Composition | Average thickness (μm) | Composition | Crystal system | Average thickness (μm) | Composition | Average thickness (μm) |
| Invention sample 1 | TiN | 0.4 | $Ti(C_{0.55}N_{0.40}O_{0.05})$ | 6.5 | $Ti(C_{0.75}N_{0.20}O_{0.05})$ | 0.5 | $Al_2O_3$ | α | 8.5 | TiN | 0.3 | 16.2 |
| Invention sample 2 | TiN | 0.4 | $Ti(C_{0.55}N_{0.40}O_{0.05})$ | 6.5 | $Ti(C_{0.75}N_{0.20}O_{0.05})$ | 0.5 | $Al_2O_3$ | α | 8.5 | TiN | 0.3 | 16.2 |
| Invention sample 3 | TiN | 0.4 | $Ti(C_{0.55}N_{0.40}O_{0.05})$ | 6.5 | $Ti(C_{0.75}N_{0.20}O_{0.05})$ | 0.5 | $Al_2O_3$ | α | 8.5 | TiN | 0.3 | 16.2 |
| Invention sample 4 | TiN | 0.4 | $Ti(C_{0.55}N_{0.40}O_{0.05})$ | 6.5 | $Ti(C_{0.75}N_{0.20}O_{0.05})$ | 0.5 | $Al_2O_3$ | α | 8.5 | TiN | 0.3 | 16.2 |
| Invention sample 5 | TiN | 0.4 | $Ti(C_{0.55}N_{0.40}O_{0.05})$ | 6.5 | $Ti(C_{0.75}N_{0.20}O_{0.05})$ | 0.5 | $Al_2O_3$ | α | 8.5 | TiN | 0.3 | 16.2 |
| Invention sample 6 | TiN | 0.4 | $Ti(C_{0.62}N_{0.36}O_{0.02})$ | 6.5 | $Ti(C_{0.75}N_{0.20}O_{0.05})$ | 0.5 | $Al_2O_3$ | α | 8.5 | TiN | 0.3 | 16.2 |
| Invention sample 7 | TiN | 0.4 | $Ti(C_{0.34}N_{0.58}O_{0.08})$ | 6.5 | $Ti(C_{0.75}N_{0.20}O_{0.05})$ | 0.5 | $Al_2O_3$ | α | 8.5 | TiN | 0.3 | 16.2 |
| Invention sample 8 | TiN | 0.4 | $Ti(C_{0.55}N_{0.40}O_{0.05})$ | 6.5 | $Ti(C_{0.85}N_{0.08}O_{0.07})$ | 0.5 | $Al_2O_3$ | α | 8.5 | TiN | 0.3 | 16.2 |
| Invention sample 9 | TiN | 0.4 | $Ti(C_{0.55}N_{0.40}O_{0.05})$ | 6.5 | $Ti(C_{0.75}N_{0.22}O_{0.03})$ | 0.5 | $Al_2O_3$ | α | 8.5 | TiN | 0.3 | 16.2 |
| Invention sample 10 | TiN | 0.4 | $Ti(C_{0.55}N_{0.40}O_{0.05})$ | 6.5 | $Ti(C_{0.75}N_{0.20}O_{0.05})$ | 0.5 | $Al_2O_3$ | α | 8.5 | TiN | 0.3 | 16.2 |
| Invention sample 11 | TiN | 0.4 | $Ti(C_{0.55}N_{0.40}O_{0.05})$ | 6.5 | $Ti(C_{0.75}N_{0.20}O_{0.05})$ | 0.5 | $Al_2O_3$ | α | 8.5 | TiN | 0.3 | 16.2 |
| Invention sample 12 | TiN | 0.4 | $Ti(C_{0.55}N_{0.40}O_{0.05})$ | 3.0 | $Ti(C_{0.75}N_{0.20}O_{0.05})$ | 0.5 | $Al_2O_3$ | α | 12.0 | TiN | 0.3 | 16.2 |
| Invention sample 13 | TiN | 0.4 | $Ti(C_{0.55}N_{0.40}O_{0.05})$ | 12.0 | $Ti(C_{0.75}N_{0.20}O_{0.05})$ | 0.5 | $Al_2O_3$ | α | 3.0 | TiN | 0.3 | 16.2 |
| Invention sample 14 | TiN | 0.4 | $Ti(C_{0.34}N_{0.58}O_{0.08})$ | 3.0 | $Ti(C_{0.75}N_{0.20}O_{0.05})$ | 0.5 | $Al_2O_3$ | α | 4.0 | TiN | 0.3 | 8.2 |
| Invention sample 15 | TiN | 0.4 | $Ti(C_{0.34}N_{0.58}O_{0.08})$ | 12.0 | $Ti(C_{0.75}N_{0.20}O_{0.05})$ | 0.5 | $Al_2O_3$ | α | 12.0 | TiN | 0.3 | 25.2 |
| Invention sample 16 | TiN | 0.4 | $Ti(C_{0.62}N_{0.36}O_{0.02})$ | 6.5 | $Ti(C_{0.75}N_{0.20}O_{0.05})$ | 0.5 | $Al_2O_3$ | α | 8.5 | TiN | 0.3 | 16.2 |
| Invention sample 17 | TiN | 0.4 | $Ti(C_{0.62}N_{0.36}O_{0.02})$ | 6.5 | $Ti(C_{0.91}O_{0.09})$ | 0.5 | $Al_2O_3$ | α | 8.5 | TiN | 0.3 | 16.2 |
| Invention sample 18 | TiN | 0.4 | $Ti(C_{0.62}N_{0.36}O_{0.02})$ | 10.0 | $Ti(C_{0.75}N_{0.20}O_{0.05})$ | 0.5 | $Al_2O_3$ | α | 7.0 | TiN | 0.3 | 18.2 |
| Invention sample 19 | TiN | 0.4 | $Ti(C_{0.62}N_{0.36}O_{0.02})$ | 10.0 | $Ti(C_{0.75}N_{0.20}O_{0.05})$ | 0.5 | $Al_2O_3$ | α | 7.0 | TiN | 0.3 | 18.2 |
| Invention sample 20 | TiN | 0.4 | $Ti(C_{0.34}N_{0.58}O_{0.08})$ | 10.0 | $Ti(C_{0.75}N_{0.20}O_{0.05})$ | 0.5 | $Al_2O_3$ | α | 7.0 | TiN | 0.3 | 18.2 |
| Invention sample 21 | TiN | 0.1 | $Ti(C_{0.55}N_{0.40}O_{0.05})$ | 6.5 | $Ti(C_{0.75}N_{0.20}O_{0.05})$ | 0.5 | $Al_2O_3$ | α | 8.5 | TiN | 0.3 | 15.9 |
| Invention sample 22 | TiN | 0.4 | $Ti(C_{0.55}N_{0.40}O_{0.05})$ | 6.5 | $Ti(C_{0.75}N_{0.20}O_{0.05})$ | 1.5 | $Al_2O_3$ | α | 8.5 | TiN | 0.3 | 17.2 |
| Invention sample 23 | TiN | 0.4 | $Ti(C_{0.55}N_{0.40}O_{0.05})$ | 6.5 | $Ti(C_{0.91}O_{0.09})$ | 1.5 | $Al_2O_3$ | α | 8.5 | TiN | 0.3 | 17.2 |
| Invention sample 24 | TiN | 0.4 | $Ti(C_{0.46}N_{0.44}O_{0.10})$ | 10.0 | $Ti(C_{0.66}N_{0.25}O_{0.09})$ | 0.5 | $Al_2O_3$ | α | 7.0 | TiN | 0.3 | 18.2 |
| Invention sample 25 | TiN | 0.4 | $Ti(C_{0.46}N_{0.44}O_{0.10})$ | 10.0 | $Ti(C_{0.66}N_{0.25}O_{0.09})$ | 0.1 | $Al_2O_3$ | α | 7.0 | TiN | 0.3 | 17.8 |

TABLE 10-continued

| | Coating layer | | | | | | | | | | | Thickness |
|---|---|---|---|---|---|---|---|---|---|---|---|---|
| | Lowermost layer | | Lower part layer | | Intermediate layer | | Upper part layer | | | Outermost layer | | |
| Sample No. | Composition | Average thickness (μm) | Composition | Average thickness (μm) | Composition | Average thickness (μm) | Composition | Crystal system | Average thickness (μm) | Composition | Average thickness (μm) | of entire coating layer (μm) |
| Invention sample 26 | TiN | 0.4 | Ti($C_{0.46}N_{0.44}O_{0.10}$) | 10.0 | Ti($C_{0.66}N_{0.25}O_{0.09}$) | 0.1 | $Al_2O_3$ | α | 7.0 | TiN | 0.3 | 17.8 |
| Invention sample 27 | TiN | 0.4 | Ti($C_{0.46}N_{0.44}O_{0.10}$) | 10.0 | Ti($C_{0.75}N_{0.20}O_{0.05}$) | 0.1 | $Al_2O_3$ | α | 7.0 | TiN | 0.3 | 17.8 |
| Invention sample 28 | TiN | 0.1 | Ti($C_{0.46}N_{0.44}O_{0.10}$) | 5.0 | Ti($C_{0.66}N_{0.25}O_{0.09}$) | 0.1 | $Al_2O_3$ | α | 12.0 | TiN | 0.3 | 17.5 |
| Invention sample 29 | TiN | 0.1 | Ti($C_{0.46}N_{0.44}O_{0.10}$) | 5.0 | Ti($C_{0.66}N_{0.25}O_{0.09}$) | 0.1 | $Al_2O_3$ | α | 12.0 | TiN | 3.0 | 20.2 |
| Invention sample 30 | TiC | 0.1 | Ti($C_{0.46}N_{0.44}O_{0.10}$) | 5.0 | Ti($C_{0.66}N_{0.25}O_{0.09}$) | 0.1 | $Al_2O_3$ | α | 12.0 | TiN | 0.3 | 17.5 |

TABLE 11

| | Coating layer | | | | | | | | | | | Thickness |
|---|---|---|---|---|---|---|---|---|---|---|---|---|
| | Lowermost layer | | Lower part layer | | Intermediate layer | | Upper part layer | | | Outermost layer | | |
| Sample No. | Composition | Average thickness (μm) | Composition | Average thickness (μm) | Composition | Average thickness (μm) | Composition | Crystal system | Average thickness (μm) | Composition | Average thickness (μm) | of entire coating layer (μm) |
| Comparative sample 1 | TiN | 0.4 | Ti($C_{0.60}N_{0.40}$) | 6.5 | Ti($C_{0.75}N_{0.20}O_{0.05}$) | 0.5 | $Al_2O_3$ | α | 8.5 | TiN | 0.3 | 16.2 |
| Comparative sample 2 | TiN | 0.4 | Ti($C_{0.60}N_{0.40}$) | 6.5 | Ti($C_{0.75}N_{0.20}O_{0.05}$) | 0.5 | $Al_2O_3$ | α | 8.5 | TiN | 0.3 | 16.2 |
| Comparative sample 3 | TiN | 0.4 | Ti($C_{0.55}N_{0.40}O_{0.05}$) | 6.5 | Ti($C_{0.75}N_{0.20}O_{0.05}$) | 0.5 | $Al_2O_3$ | α | 8.5 | TiN | 0.3 | 16.2 |
| Comparative sample 4 | TiN | 0.4 | Ti($C_{0.55}N_{0.40}O_{0.05}$) | 6.5 | Ti($C_{0.75}N_{0.20}O_{0.05}$) | 0.5 | $Al_2O_3$ | α | 8.5 | TiN | 0.3 | 16.2 |
| Comparative sample 5 | TiN | 0.4 | Ti($C_{0.55}N_{0.40}O_{0.05}$) | 17.0 | Ti($C_{0.75}N_{0.20}O_{0.05}$) | 0.5 | $Al_2O_3$ | α | 17.0 | TiN | 0.3 | 35.2 |
| Comparative sample 6 | TiN | 0.4 | Ti($C_{0.34}N_{0.58}O_{0.08}$) | 12.0 | Ti($C_{0.75}N_{0.20}O_{0.05}$) | 0.5 | $Al_2O_3$ | α | 12.0 | TiN | 0.3 | 25.2 |
| Comparative sample 7 | TiN | 0.4 | Ti($C_{0.46}N_{0.44}O_{0.10}$) | 10.0 | Ti($C_{0.66}N_{0.25}O_{0.09}$) | 0.1 | $Al_2O_3$ | α | 7.0 | TiN | 0.3 | 17.8 |
| Comparative sample 8 | TiN | 0.4 | Ti($C_{0.40}N_{0.60}$) | 6.5 | Ti($C_{0.75}N_{0.20}O_{0.05}$) | 0.5 | $Al_2O_3$ | α | 8.5 | TiN | 0.3 | 16.2 |
| Comparative sample 9 | TiN | 0.4 | Ti($C_{0.40}N_{0.60}$) | 10.0 | Ti($C_{0.66}N_{0.25}O_{0.09}$) | 0.1 | $Al_2O_3$ | α | 7.0 | TiN | 0.3 | 17.8 |
| Comparative sample 10 | TiN | 0.4 | Ti($C_{0.60}N_{0.40}$) | 3.0 | Ti($C_{0.91}O_{0.09}$) | 0.5 | $Al_2O_3$ | α | 4.0 | TiN | 0.3 | 8.2 |

The FWHM of the rocking curve of a plane (4,2,2) of the obtained sample was measured under the following measurement conditions. Specifically, firstly, 2θ(°) of the plane (4,2,2) of the lower part layer was identified using a general X-ray diffractometer, and the FWHM of the rocking curve was measured under the following measurement conditions.

(Measurement conditions) ω: step mode, characteristic X-ray: CuKα ray, origin of 2θ: fixed value of 2θ(°) measured through X-ray diffraction, step width: 1°, measurement time: 10 sec/step, scan angle: 30° to 90°

Meanwhile, the FWHM of the rocking curve of a plane (0,0,12) of the sample was measured under the following measurement conditions.

(Measurement conditions) ω: step mode, characteristic X-ray: CuKα ray, origin of 2θ: fixed value of 90.665°, step width: 1°, measurement time: 10 sec/step, scan angle: 6.3° to 69.3°

The results are shown in Table 12 and Table 13.

Further, the average particle size of the particles forming the lower part layer of the obtained sample was obtained by observing a cross-sectional structure of the lower part layer. Specifically, a cross-sectional surface of the sample in a direction parallel to the surface of the substrate was mirror-polished, and the obtained mirror-polished surface was used as a cross-sectional structure. The lower part layer was mirror-polished using colloidal silica. Then, the sample was set to the FE-SEM so that the cross-sectional structure of the lower part layer can be irradiated with an electron beam, and the sample was irradiated with an electron beam under conditions that an incident angle is 70°, an acceleration voltage is 15 kV, and an irradiation current is 0.5 nA. Here, the sample was measured in a measurement range of 30 μm×50 μm with an EBSD set to a step size of 0.1 μm. A particle was defined as a region surrounded by a structure boundary with a misorientation of 5° or more. The diameter of a circle whose area was equal to the area of a particle was defined as a particle size of such particle. Here, image analysis software was used when obtaining the particle size from the cross-sectional structure of the lower part layer. The particle sizes of the lower part layer were measured through the measurement described above, and the average value (arithmetic mean) of all the obtained particle sizes of the particles was defined as the average particle size. The results are shown in Table 12 and Table 13.

TABLE 12

| Sample No. | Lower part layer FWHM (°) of rocking curve of plane (4, 2, 2) | Upper part layer FWHM (°) of rocking curve of plane (0, 0, 12) | Lower part layer average particle size (μm) |
|---|---|---|---|
| Invention sample 1 | 16 | 13 | 0.8 |
| Invention sample 2 | 8 | 13 | 0.8 |
| Invention sample 3 | 20 | 13 | 0.8 |
| Invention sample 4 | 16 | 6 | 0.8 |
| Invention sample 5 | 16 | 18 | 0.8 |
| Invention sample 6 | 16 | 13 | 0.8 |
| Invention sample 7 | 16 | 13 | 0.8 |
| Invention sample 8 | 16 | 13 | 0.8 |
| Invention sample 9 | 16 | 13 | 0.8 |
| Invention sample 10 | 16 | 13 | 1.5 |
| Invention sample 11 | 16 | 13 | 0.5 |
| Invention sample 12 | 16 | 13 | 0.8 |
| Invention sample 13 | 16 | 13 | 0.8 |
| Invention sample 14 | 16 | 13 | 0.8 |
| Invention sample 15 | 16 | 13 | 0.8 |
| Invention sample 16 | 8 | 6 | 0.8 |
| Invention sample 17 | 16 | 13 | 0.8 |
| Invention sample 18 | 11 | 13 | 1.2 |
| Invention sample 19 | 11 | 13 | 0.5 |
| Invention sample 20 | 11 | 13 | 0.5 |
| Invention sample 21 | 16 | 13 | 0.8 |
| Invention sample 22 | 16 | 13 | 0.8 |
| Invention sample 23 | 16 | 13 | 0.8 |
| Invention sample 24 | 20 | 18 | 1.2 |
| Invention sample 25 | 20 | 18 | 1.2 |
| Invention sample 26 | 8 | 18 | 0.8 |
| Invention sample 27 | 16 | 18 | 0.8 |
| Invention sample 28 | 16 | 18 | 0.8 |
| Invention sample 29 | 16 | 18 | 0.8 |
| Invention sample 30 | 16 | 18 | 0.8 |

TABLE 13

| Sample No. | Lower part layer FWHM (°) of rocking curve of plane (4, 2, 2) | Upper part layer FWHM (°) of rocking curve of plane (0, 0, 12) | Lower part layer average particle size (μm) |
|---|---|---|---|
| Comparative sample 1 | 25 | 13 | 0.8 |
| Comparative sample 2 | 16 | 13 | 0.8 |
| Comparative sample 3 | 26 | 13 | 0.8 |
| Comparative sample 4 | 16 | 27 | 0.8 |
| Comparative sample 5 | 16 | 13 | 0.8 |
| Comparative sample 6 | 26 | 27 | 0.8 |
| Comparative sample 7 | 26 | 27 | 0.8 |
| Comparative sample 8 | 16 | 27 | 1.2 |
| Comparative sample 9 | 16 | 27 | 1.2 |
| Comparative sample 10 | 26 | 13 | 0.8 |

Cutting test 1 and cutting test 2 were conducted using the obtained invention samples 1 to 30 and comparative samples 1 to 10 under the following conditions. Cutting test 1 is a wear test for evaluating wear resistance, and cutting test 2 is a fracture test for evaluating fracture resistance.

Cutting Test 1
Used substrate: substrate 1
Workpiece: S45C round bar
Cutting speed: 230 m/min
Feed: 0.25 mm/rev
Depth of cut: 2.0 mm
Coolant: used Evaluation items: A time when a sample was fractured or had the largest flank wear width of 0.2 mm was defined as the end of the tool life, and the machining time to reach the end of the tool life was measured. Further, a damaged condition at a machining time of 15 minutes was checked by a SEM.

Cutting Test 2
Used substrate: substrate 2
Workpiece: S45C round bar with two grooves
Cutting speed: 150 m/min
Feed: 0.15 mm/rev
Depth of cut: 1.7 mm
Coolant: used Evaluation items: A time when a sample was fractured or had the largest flank wear width of 0.2 mm was defined as the end of the tool life, and the number of shocks the sample had received by the end of the tool life was measured. Further, a damaged condition when the number of shocks was 5,000 was observed by the SEM.

As to the machining time to reach the end of the tool life in cutting test 1 (wear test), evaluations were made with "A" for 40 minutes or more, "B" for 30 minutes or more and less than 40 minutes, and "C" for less than 30 minutes. Further, as to the number of shocks by the end of the tool life in cutting test 2 (fracture test), evaluations were made with "A" for 13,000 or more, "B" for 11,000 or more and less than 13,000, and "C" for less than 11,000. In such evaluations, "A" refers to excellent, "B" refers to good, and "C" refers to inferior, meaning that a sample with a larger number of "A"s or "B"s has more excellent cutting performance. The obtained evaluation results are shown in Table 14 and Table 15.

TABLE 14

| Sample No. | Cutting test 1 | | | Cutting test 2 | | |
|---|---|---|---|---|---|---|
| | Damaged condition at machining time of 15 minutes | Machining time (min) | Evaluation | Damaged condition when number of shocks is 5,000 | Number of shocks (number of times) | Evaluation |
| Invention sample 1 | Normal wear | 41 | A | Normal wear | 13,900 | A |
| Invention sample 2 | Normal wear | 42 | A | Normal wear | 15,000 | A |
| Invention sample 3 | Normal wear | 38 | B | Normal wear | 12,300 | B |
| Invention sample 4 | Normal wear | 43 | A | Normal wear | 15,000 | A |
| Invention sample 5 | Normal wear | 36 | B | Normal wear | 13,900 | A |
| Invention sample 6 | Normal wear | 43 | A | Normal wear | 12,900 | B |
| Invention sample 7 | Normal wear | 38 | B | Normal wear | 14,600 | A |
| Invention sample 8 | Normal wear | 40 | A | Normal wear | 14,000 | A |
| Invention sample 9 | Normal wear | 39 | B | Normal wear | 13,500 | A |
| Invention sample 10 | Normal wear | 38 | B | Normal wear | 14,700 | A |
| Invention sample 11 | Normal wear | 44 | A | Normal wear | 13,600 | A |
| Invention sample 12 | Normal wear | 37 | B | Normal wear | 12,400 | B |
| Invention sample 13 | Normal wear | 38 | B | Normal wear | 12,100 | B |
| Invention sample 14 | Normal wear | 31 | B | Normal wear | 12,200 | B |
| Invention sample 15 | Normal wear | 42 | A | Chipping | 13,300 | A |
| Invention sample 16 | Normal wear | 44 | A | Normal wear | 15,000 | A |
| Invention sample 17 | Normal wear | 43 | A | Normal wear | 12,100 | B |
| Invention sample 18 | Normal wear | 40 | A | Normal wear | 11,800 | B |
| Invention sample 19 | Normal wear | 45 | A | Normal wear | 11,600 | B |
| Invention sample 20 | Normal wear | 37 | B | Normal wear | 14,300 | A |
| Invention sample 21 | Normal wear | 40 | A | Normal wear | 13,700 | A |
| Invention sample 22 | Normal wear | 39 | B | Normal wear | 12,700 | B |
| Invention sample 23 | Normal wear | 38 | B | Normal wear | 12,700 | B |
| Invention sample 24 | Normal wear | 35 | B | Normal wear | 11,100 | B |
| Invention sample 25 | Normal wear | 35 | B | Normal wear | 11,200 | B |
| Invention sample 26 | Normal wear | 38 | B | Normal wear | 15,000 | A |
| Invention sample 27 | Normal wear | 37 | B | Normal wear | 12,800 | B |
| Invention sample 28 | Normal wear | 35 | B | Normal wear | 13,900 | A |
| Invention sample 29 | Normal wear | 37 | B | Chipping | 12,600 | B |
| Invention sample 30 | Normal wear | 35 | B | Normal wear | 13,400 | A |

TABLE 15

| Sample No. | Cutting test 1 | | | Cutting test 2 | | |
|---|---|---|---|---|---|---|
| | Damaged condition at machining time of 15 minutes | Machining time (min) | Evaluation | Damaged condition when number of shocks is 5,000 | Number of shocks (number of times) | Evaluation |
| Comparative sample 1 | Chipping | 20 | C | Chipping | 7,900 | C |
| Comparative sample 2 | Chipping | 22 | C | Chipping | 9,000 | C |
| Comparative sample 3 | Chipping | 23 | C | Chipping | 9,700 | C |
| Comparative sample 4 | Normal wear | 25 | C | Chipping | 10,000 | C |
| Comparative sample 5 | Fracturing | 12 | C | Chipping | 10,200 | C |
| Comparative sample 6 | Chipping | 22 | C | Chipping | 6,200 | C |
| Comparative sample 7 | Chipping | 26 | C | Chipping | 6,700 | C |
| Comparative sample 8 | Normal wear | 31 | B | Chipping | 8,600 | C |
| Comparative sample 9 | Normal wear | 28 | C | Chipping | 8,300 | C |
| Comparative sample 10 | Chipping | 18 | C | Chipping | 8,700 | C |

The results of Table 14 and Table 15 show that each invention sample got "B" or higher in both the wear test and the fracture test. Meanwhile, as to the evaluations on comparative samples, each comparative sample got "C" in one or both of the wear test and the fracture test. In particular, in the wear test, all invention samples got "B" or higher, and all comparative samples got "C." It is therefore found that all invention samples are excellent in wear resistance compared to comparative samples.

From the results described above, it is found that invention samples are excellent in wear resistance and fracture resistance, and as a result, have long tool lives.

INDUSTRIAL APPLICABILITY

The coated cutting tool of the present invention achieves excellent wear resistance without a reduction in fracture resistance, and can thus achieve extension of its tool life from the conventional ones. From such perspective, the coated cutting tool of the present invention has industrial applicability.

REFERENCE SIGNS LIST

1: Substrate, 2: Lowermost layer, 3: Lower part layer, 4: Intermediate layer, 5: Upper part layer, 6: Outermost layer, 7: Coating layer, 8: Coated cutting tool.

What is claimed is:

1. A coated cutting tool, comprising:
a substrate; and
a coating layer formed on the substrate, wherein
the coating layer includes a lower part layer and an upper part layer formed on the lower part layer,
the lower part layer has an average thickness of 2.0 μm or more and 15.0 μm or less, and is formed of a Ti oxycarbonitride layer including a compound having a composition represented by formula (1) below:

$$\text{Ti}(C_{1-x-y}N_xO_y) \quad (1)$$

(where, x denotes an atomic ratio of an N element based on a total of a C element, the N element, and an O element, y denotes an atomic ratio of the O element based on a total of the C element, the N element, and the O element, and $0.35 \leq x \leq 0.60$ and $0.01 \leq y \leq 0.10$ are satisfied),
a full width at half maximum of a rocking curve of a plane (4,2,2) of the lower part layer, which is obtained through X-ray diffraction, is 20° or less,
the upper part layer is formed of an α-aluminum oxide layer having an average thickness of 1.0 μm or more and 15.0 μm or less, and
a full width at half maximum of a rocking curve of a plane (0,0,12) of the upper part layer, which is obtained through X-ray diffraction, is 18° or less.

2. The coated cutting tool according to claim 1, wherein each of particles forming the lower part layer has an average particle size of 0.5 μm or more and 1.5 μm or less.

3. The coated cutting tool according to claim 1, wherein the coating layer includes, between the lower part layer and the upper part layer, an intermediate layer formed of a Ti compound layer including a compound having a composition represented by formula (2) below:

$$\text{Ti}(C_{1-a-b}N_aO_b) \quad (2)$$

(where, a denotes the atomic ratio of the N element based on a total of the C element, the N element, and the O element, b denotes the atomic ratio of the O element based on a total of the C element, the N element, and the O element, and $0.00 \leq a \leq 0.30$ and $0.01 \leq b \leq 0.10$ are satisfied), and
the intermediate layer has an average thickness of 0.05 μm or more and 1.50 μm or less.

4. The coated cutting tool according to claim 1, wherein the coating layer includes a lowermost layer formed of a Ti nitride layer or a Ti carbide layer between the substrate and the lower part layer, and
the lowermost layer has an average thickness of 0.1 μm or more and 1.5 μm or less.

5. The coated cutting tool according to claim 1, wherein the entire coating layer has an average thickness of 3.0 μm or more and 25.0 μm or less.

6. The coated cutting tool according to claim 1, wherein the substrate is one of a cemented carbide, cermet, ceramics, and a cubic boron nitride sintered body.

7. The coated cutting tool according to claim 2, wherein the coating layer includes, between the lower part layer and the upper part layer, an intermediate layer formed of a Ti compound layer including a compound having a composition represented by formula (2) below:

$$Ti(C_{1-a-b}N_aO_b) \qquad (2)$$

(where, a denotes the atomic ratio of the N element based on a total of the C element, the N element, and the O element, b denotes the atomic ratio of the O element based on a total of the C element, the N element, and the O element, and $0.00 \leq a \leq 0.30$ and $0.01 \leq b \leq 0.10$ are satisfied), and
the intermediate layer has an average thickness of 0.05 μm or more and 1.50 μm or less.

8. The coated cutting tool according to claim 2, wherein the coating layer includes a lowermost layer formed of a Ti nitride layer or a Ti carbide layer between the substrate and the lower part layer, and
the lowermost layer has an average thickness of 0.1 μm or more and 1.5 μm or less.

9. The coated cutting tool according to claim 3, wherein the coating layer includes a lowermost layer formed of a Ti nitride layer or a Ti carbide layer between the substrate and the lower part layer, and
the lowermost layer has an average thickness of 0.1 μm or more and 1.5 μm or less.

10. The coated cutting tool according to claim 7, wherein the coating layer includes a lowermost layer formed of a Ti nitride layer or a Ti carbide layer between the substrate and the lower part layer, and
the lowermost layer has an average thickness of 0.1 μm or more and 1.5 μm or less.

11. The coated cutting tool according to claim 2, wherein the entire coating layer has an average thickness of 3.0 μm or more and 25.0 μm or less.

12. The coated cutting tool according to claim 3, wherein the entire coating layer has an average thickness of 3.0 μm or more and 25.0 μm or less.

13. The coated cutting tool according to claim 4, wherein the entire coating layer has an average thickness of 3.0 μm or more and 25.0 μm or less.

14. The coated cutting tool according to claim 7, wherein the entire coating layer has an average thickness of 3.0 μm or more and 25.0 μm or less.

15. The coated cutting tool according to claim 8, wherein the entire coating layer has an average thickness of 3.0 μm or more and 25.0 μm or less.

16. The coated cutting tool according to claim 9, wherein the entire coating layer has an average thickness of 3.0 μm or more and 25.0 μm or less.

17. The coated cutting tool according to claim 10, wherein the entire coating layer has an average thickness of 3.0 μm or more and 25.0 μm or less.

18. The coated cutting tool according to claim 2, wherein the substrate is one of a cemented carbide, cermet, ceramics, and a cubic boron nitride sintered body.

19. The coated cutting tool according to claim 3, wherein the substrate is one of a cemented carbide, cermet, ceramics, and a cubic boron nitride sintered body.

20. The coated cutting tool according to claim 4, wherein the substrate is one of a cemented carbide, cermet, ceramics, and a cubic boron nitride sintered body.

* * * * *